United States Patent [19]

Chenevas-Paule et al.

[11] Patent Number: 4,529,617
[45] Date of Patent: Jul. 16, 1985

[54] PROCESS FOR THE AMORPHOUS GROWTH OF AN ELEMENT WITH CRYSTALLIZATION UNDER RADIATION

[75] Inventors: Andre Chenevas-Paule, Grenoble; Robert Cuchet, Clelles; Jean-Francois Eloy, Saint Ismier, all of France

[73] Assignee: Commissariat a l'Energie Atomique, Paris, France

[21] Appl. No.: 601,421

[22] Filed: Apr. 18, 1984

[30] Foreign Application Priority Data

Apr. 25, 1983 [FR] France .................. 83 06749

[51] Int. Cl.³ ............................. B05D 5/12
[52] U.S. Cl. .................... 427/53.1; 427/86; 219/121 L
[58] Field of Search .......... 427/53.1, 54.1, 86, 427/85; 219/121 L

[56] References Cited

U.S. PATENT DOCUMENTS

| 3,343,829 | 8/1982 | Tochikubo et al. | 427/53.1 |
| 3,519,901 | 7/1970 | Bean et al. | 357/40 |
| 4,059,461 | 11/1977 | Fan et al. | 427/53.1 |
| 4,187,126 | 2/1980 | Radd et al. | 427/86 |
| 4,309,225 | 1/1982 | Fan et al. | 427/53.1 |
| 4,317,844 | 3/1982 | Carlson | 427/39 |

OTHER PUBLICATIONS

Chittick et al. *J. Electrochem. Soc. Solid State Science*, vol. 116, No. 1, Jan. 1969, pp. 77-81.

Yang et al., *Journ. of Crystal Growth*, vol. 56, No. 2, Jan. 1982, pp. 429-432.

Bauerle et al., *Applied Physics A. Solios and Surfaces*, vol. A30, No. 3, Mar. 1983, pp. 147-149.

*Primary Examiner*—John H. Newsome
*Attorney, Agent, or Firm*—James E. Nilles

[57] ABSTRACT

The present invention relates to a process for the amorphous growth of an element with crystallization under radiation.

An element is deposited on a support contained in an enclosure under a vacuum in known manner and simultaneously one or more predetermined surfaces of the layer deposited on the support are irradiated, said irradiation being obtained by a coherent electromagnetic irradiation radiation beam having a power and wavelength suitable for desorbing said surfaces.

10 Claims, 4 Drawing Figures

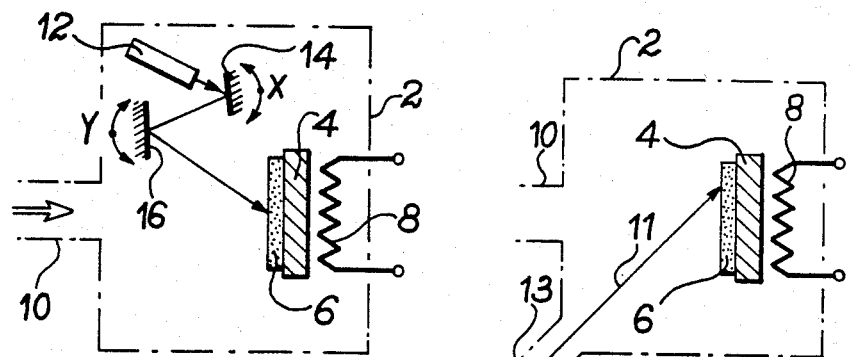
FIG. 1
FIG. 1a
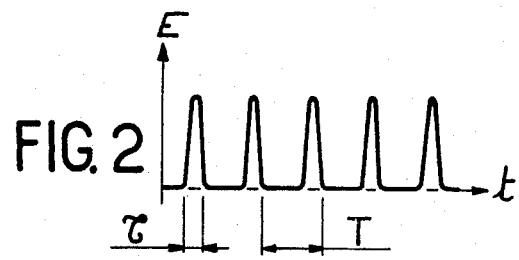
FIG. 2
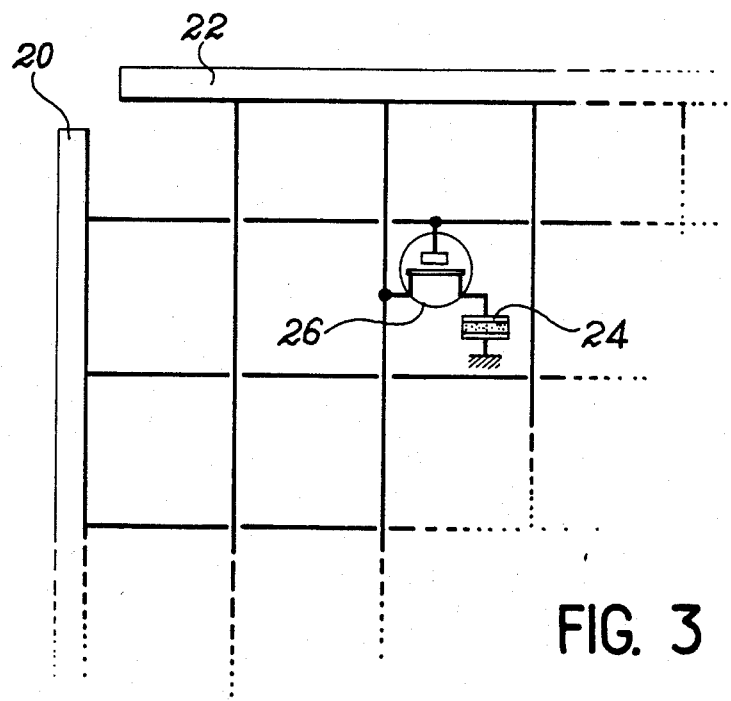
FIG. 3

PROCESS FOR THE AMORPHOUS GROWTH OF AN ELEMENT WITH CRYSTALLIZATION UNDER RADIATION

BACKGROUND OF THE INVENTION

The present invention relates to a process for amorphous growth with local crystallization under coherent electromagnetic radiation. It makes it possible to obtain thin semiconductor crystalline layers.

Several conventional crystallization methods are known. The simplest method is thermal annealing, which consists of heating the film obtained by amorphous growth on a substrate. In the case of silicon, the heating temperature is approximately 800° C. This method has the advantage of being simple, but has the disadvantage of leading to twin crystals forming in the layer. Moreover, this method is of an overall or total nature and is less flexible than local crystallization or recrystallization methods.

There are also methods using photocrystallization, such as recrystallization by scanned or pulsed laser beams, which perform the local recrystallization of a layer by heating. The disadvantage of this is that the temperature reached at the impact point of the laser beam on the growth film is often above the melting temperature of the element or substance constituting said film. This leads to differential expansion stresses between the heated area and the area surrounding it. This leads to numerous defects in the film, such as cracks and microscopic faults which are responsible for leakage currents. However, these methods relate to an annealing, in this case local, on layers of materials which have already been deposited.

A process using evaporation is also known, namely the molecular jet process, which is based on the principle of evaporation under an ultra-high vacuum, i.e. under a pressure of $10^{-7}$ to $10^{-9}$ Pa on the basis of Kundsen effusion cells. On the basis of this cell, it is possible to obtain a relatively directional jet of molecules or atoms in order to epitaxially cover a relatively small surface.

This procedure leads to a very thin layer epitaxy (a few angströms) and whose thickness is well controled. In this way, it is possible to prepare compounds ayer by layer. However, its main disadvantage is that it requires an ultra-high vacuum, so that it is complicated and costly. Therefore, the costs involved in obtaining layers by this procedure is generally incompatible with mass production.

BRIEF SUMMARY OF THE INVENTION

The object of the present invention is to obviate the disadvantages encountered in the prior art. Thus, the invention relates to a process for growing an element or substance on a substrate, with simultaneously permitting amorphous growth and crystalline growth.

More specifically, the present invention relates to a process for the amorphous growth of an element with local crystallization under coherent electromagnetic radiation, the growth of said element being carried out on a support contained in an enclosure under a vacuum and which contains a source of said element. It is characterized in that there is a continuous deposition in amorphous form of the element on the support, accompanied by the simultaneous temporary irradiation of one or several predetermined areas of the layer deposited on the support during said continuous deposition. This irradiation is obtained by a coherent electromagnet irradiation radiation beam, the power W of the beam and the coherent electromagnetic irradiation radiation energy being suitable for bringing about a desorption of said areas.

According to a first embodiment of the invention, the coherent electromagnetic irradiation radiation beam is emitted in the form of low frequency pulses.

According to a second embodiment of the invention, the coherent electromagnetic irradiation radiation beam is a spatially scanned, continuous light source.

The photodesorption of the irradiated areas "cleans" them, which permits an epitaxial growth thereon. Thus, the invention does not relate to a total or local annealing, but to an irradiation during the deposition of the material, which brings about a crystallization.

According to a very interesting secondary feature of the invention, to the element to be deposited is added elements permitting the doping thereof. The addition of these doping elements can be sequential and a function of the desired semiconductor. Thus, this feature makes it possible to very easily obtain either intrinsic layers, or p doped layers, or n doped layers, said different layers being successively produceable by simply changing the atmosphere in the enclosure.

According to a secondary feature, the irradiation pulse emission frequency is below 5 Hz.

According to a preferred embodiment of the process according to the invention in which the element is silicon, the wavelength $\lambda$ of the coherent electromagnetic irradiation radiation is below 400 nm.

According to a preferred embodiment of the process according to the invention in which said element is silicon, the substrate temperature is between 300 to 500° C.

According to another preferred embodiment of the invention, the element is silicon and the source thereof is accompanied by boron or phosphorus.

This embodiment makes it possible to obtain silicon-based semiconductors successively having p, n doped layers or intrinsic layers, as a function of whether the doping elements are present or absent.

Although the molecular jet method permits GaAs-type doping, it cannot be used in the case of silicon. Thus, such layers cannot at present be obtained by a silicon molecular jet, because the boron and phosphorus bonding coefficient is too low at low temperatures (400° C.). The only way of obtaining this type of spatial composition modulation in this configuration (stable only at low temperature) is low energy ion implantation, which complicates the procedure.

The invention makes it possible to obviate this problem, because it makes it possible to directly obtain n, p layers by the incorporation of $B_2H_6$ or $PH_3$ into the $SiH_4$, the incorporation of P and B probably being assisted by light.

BRIEF DESCRIPTION OF THE DRAWINGS

The invention is described in greater detail hereinafter relative to non-limitative embodiments and the attached drawings, wherein show: FIG. 1 diagrammatically a device for performing the process according to the invention. FIG. 1a diagrammatically, another device for performing the invention. FIG. 2 the energy emitted by the coherent electromagnetic irradiation radiation beam as a function of time. FIG. 3 diagrammatically, an application obtained by means of the process according to the invention.

DETAILED DESCRIPTION OF THE INVENTION

The process according to the invention consists of growing an element or substance, such as e.g. a semiconductor, in amorphous form on a substrate and simultaneously obtaining a local crystallization thereof by excitation by means of a coherent electromagnetic irradiation radiation beam. Numerous methods are known for depositing amorphous or other semiconductors. Reference is e.g. made to cathodic sputtering molecular Jet. chemical liquid deposition, chemical deposition vapour which may or may not be plasma assisted, etc. For example, FIG. 1 shows a device for performing the chemical vapour deposition method.

This device comprises an enclosure 2 which is under a vacuum, containing a support 4 on which grows the element to be deposited, thus constituting a layer 6. Support 4 can be heated by means 8. The element to be deposited is evaporated and is introduced into the enclosure through an orifice 10. The device also comprises a coherent electromagnetic irradiation radiation source 12 emitting a beam which, after two reflections on mirrors 14 and 16, reaches layer 6. Mirror 14 effects a deflection of the laser beam in a direction parallel to one of the edges of support 4 and mirror 16 effects a deflection of the same beam in a direction orthogonal to that of the mirror 14. The combined action of the two mirrors 14 and 16 consequently makes it possible to reach any point on the surface of layer 6 with the radiation beam. It also makes it possible to carry out a scan of part or all of the said surface.

In the case of a silicon deposit, an amorphous layer 6 is obtained if the enclosure temperature is below 600° C. This temperature must be sufficiently high for the silicon to condense on layer 6. For example, a temperature of approximately 400° C. is chosen.

For example, means 12 can be a laser beam, which emits coherent electromagnetic radiation which effects a local crystallization of the silicon deposited on layer 6. This beam can be directed onto a point of the surface of layer 6, but it can also scan the entire surface by means of the two mirrors 14 and 16. This coherent electromagnetic radiation is emitted in the form of very short pulses, e.g. lasting approximately 10 ns, at a frequency of a few hertz. Instead of using coherent electromagnetic radiation emitted in the form of very short pulses, it would also be possible to use spatially scanned continuous coherent electromagnetic radiation. The latter is constituted by intense rays able to desorb the excited area of layer 6. For example, in the case of a silicon layer 6, the irradiation radiation can be ultraviolet radiation. This pulsed or continuous irradiation does not anneal the already deposited layers. Instead, on each impact, the energy of the ultraviolet photons and the power of the beam desorb the surface, i.e. supply energy to the absorbed silicon atoms which have not yet been chemically bonded. This permits the movement thereof and consequently aids the crystalline growth. The ultraviolet radiation pulses consequently clean the surface and make it suitable for epitaxy.

Thus, this process permits an epitaxial growth of a silicon layer at low temperatures (400° C.) and over large surfaces (with ultraviolet radiation beam scanning). This process can more particularly be used for obtaining polycrystals on molten $SiO_2$ or other insulating substrates, monocrystals or epitaxial layers on crystalline silicon, sapphire, garnet, fluorides (such as $CaF_2$) or the like. It can also be used in graphoepitaxy.

The drawing shows enclosure 2 containing a support 4 on which is grown a layer 6, said support 4 being heatable by means 9. The composition containing the material to be deposited enters enclosure 2 by means of pipe 10. However, in the device shown here, the coherent electromagnetic radiation 11 introduced by 13 into enclosure 2 directly strikes the layer 6 being formed. Not shown means permit the possible displacement either of the coherent electromagnetic radiation, or of the support 4 and the layer 6, in order to carry out a scan.

FIG. 2 is a graph showing the energy of the ultraviolet radiation beam as a function of time. The width $\tau$ of each pulse is approximately 15 ns. The frequency of the pulses is at the most a few Hertz and can be e.g. 0.5 Hz, i.e. a cycle T of 2 seconds. The laser beam is constituted by intense ultraviolet radiation, the wavelength $\lambda$ thereof being e.g. 350 nm and the power W of the laser is 35 MW.

As a result of the process according to the invention, a silicon layer is consequently obtained in which amorphous regions and crystalline regions can exist. Such a structure has numerous industrial applications, among which are the production of microelectronics circuits on insulating substrates for the production of three-dimensional circuits, the production of shift registers for flat liquid crystal screens, the production of electronic circuits for addressing photodetection strips, or bubble store decoding electronics. When operating under the conditions as defined with reference to FIG. 2, it has been possible to obtain a sequence p(100 Å); i(500 Å); n (100 Å), which is periodically repeated to obtain a structure nipi (very photosensitive, with possibilities of modulating the absorption level $\alpha$ and the luminescence spectrum).

FIG. 3 shows an addressing circuit for liquid crystal screens. The addressing circuits comprises a row addressing register 20 and a column addressing register 22. The addressing of each element 24 of the liquid crystal screen is brought about by switching off a switch, such as a transistor 26, controlled by a row of register 20 and by a control signal emitted by a column of register 22.

Addressing takes place row-by-row in conventional manner, register 22 operating at a frequency p times higher than register 20 if the liquid crystal screen has p columns. Thus, register 22 must be made from crystalline silicon in order to be able to operate at high frequencies, whereas register 20 can be made either from amorphous silicon or crystalline silicon. This addressing circuit can consequently be advantageously produced by means of a process according to the invention, register 20 being of amorphous silicon and register 22 of silicon crystallized by irradiation radiation.

What is claimed is:

1. A process for the amorphous growth of an element with local crystallization under coherent electromagnetic raidiation, the growth of said element being effected on a support contained in an enclosure which is under a vacuum, said enclosure containing the source of said element, which process comprises:
    (a) continuously depositing said element on the support in amorphous form, and
    (b) temporarily irradiating one or more predetermined surfaces of the layer deposited on the support during said continuous deposition, wherein said irradiation is effected by a coherent electromagnetic radiation beam, the power W of the beam being able to effect a desorption of said surface, and the wavelength λ of the coherent electromagnetic radiation being below 400 nm.

2. The process according to claim 1, wherein the coherent electromagnetic radiation beam is emitted in the form of low frequency pulses.

3. The process according to claim 1, wherein the coherent electromagnetic radiation beam is a spatially scanned continuous light source.

4. The process according to claim 1, wherein doping elements are sequentially added to the source of said element.

5. The process according to claim 2, wherein the pulse emission frequency is below 5 Hz.

6. The process according to claim 5, in which the said element is silicon, wherein the temperature of the substrate is between 300° and 500 ° C.

7. The process according to claim 1, wherein the element is boron-doped silicon.

8. The process according to claim 1, wherein the said element is phosphorus-doped silicon.

9. The process according to claim 2, wherein the coherent electromagnetic radiation beam is emitted in the form of very short pulses lasting approximately 10 ns.

10. The process according to claim 1, wherein the coherent electromagnetic radiation beam is a laser beam having a wavelength λ of about 350 nm and a power W of 35 MW.

* * * * *